United States Patent
Van Cai

(10) Patent No.: US 8,982,995 B1
(45) Date of Patent: Mar. 17, 2015

(54) COMMUNICATION DEVICE AND METHOD OF MULTIPATH COMPENSATION FOR DIGITAL PREDISTORTION LINEARIZATION

(71) Applicant: Microelectronics Technology Inc., Hsinchu (TW)

(72) Inventor: Khiem Van Cai, Brea, CA (US)

(73) Assignee: Microelectronics Technology Inc., Hsinchu (TW)

( * ) Notice: Subject to any disclaimer, the term of this patent is extended or adjusted under 35 U.S.C. 154(b) by 0 days.

(21) Appl. No.: 14/071,678

(22) Filed: Nov. 5, 2013

(51) Int. Cl.
*H04L 25/03* (2006.01)
*H04B 1/04* (2006.01)

(52) U.S. Cl.
CPC ...... *H04B 1/0475* (2013.01); *H04B 2001/0425* (2013.01)
USPC .......................................................... 375/297

(58) Field of Classification Search
USPC ........................................ 375/219, 296, 297
See application file for complete search history.

(56) References Cited

U.S. PATENT DOCUMENTS

| | | | |
|---|---|---|---|
| 2004/0017859 A1* | 1/2004 | Sills et al. | 375/296 |
| 2006/0008028 A1* | 1/2006 | Maltsev et al. | 375/297 |
| 2012/0120990 A1* | 5/2012 | Koren et al. | 375/219 |
| 2014/0294120 A1* | 10/2014 | Gandhi et al. | 375/297 |

* cited by examiner

*Primary Examiner* — Don N Vo
(74) *Attorney, Agent, or Firm* — Novak Druce Connolly Bove + Quigg LLP

(57) ABSTRACT

A method of multipath compensation for digital pre-distortion (DPD) linearization suppresses linear distortion caused by reflected signals and distortion in transmitting and receiving paths. Reflection suppression suppresses effects of the linear distortion on the transmitting and receiving paths.

18 Claims, 3 Drawing Sheets

COMMUNICATION DEVICE AND METHOD OF MULTIPATH COMPENSATION FOR DIGITAL PREDISTORTION LINEARIZATION

BACKGROUND

1. Technical Field

Embodiments of the present disclosure relate to signal processing, and more particularly to systems, and devices and a method of multipath compensation for digital pre-distortion linearization.

2. Description of Related Art

In wireless communication, a multi carrier signal is transmitted using a power amplifier (PA). Radio transmitter amplifiers in most telecommunications systems are required to be "linear", which means accurately reproducing the input signal. An amplifier that compresses input signals or has a non-linear input/output relationship causes the output signal to splatter onto adjacent radio frequencies. This causes interference to other radio channels.

Predistortion is a technique used to improve the linearity of radio transmitter amplifiers. The multi carrier PA (MCPA) transmission should transmit the signal at a very high efficiency while maintaining acceptable signal quality and a high adjacent channel power ratio (ACPR) to meet the spectral emissions mask (SEM) requirements.

The transmission system would employ a digital pre-distortion (DPD) linearizer to suppress the intermodulation distortion to achieve high ACPR. To achieve this goal, the DPD linearizer compares observed transmission signals with observed feedback signals and derives the optimum solution that is applied to the DPD function to reverse the effects of the PA non-linearity, and improve the ACPR.

In addition to PA distortion, however, multipath distortions also exist along a transmission path. These linear distortions may degrade the DPD linearization performance.

DETAILED DESCRIPTION

The disclosure is illustrated by way of example and not by way of limitation in the accompanying drawings in which like references indicate similar elements. Various embodiments illustrate different features of the disclosure. It should be noted that references to "an" or "one" embodiment in this disclosure are not necessarily to the same embodiment, and such references can mean "at least one." Description of components in the embodiments is given for the purpose of illustrating rather than limiting.

Figure 1:
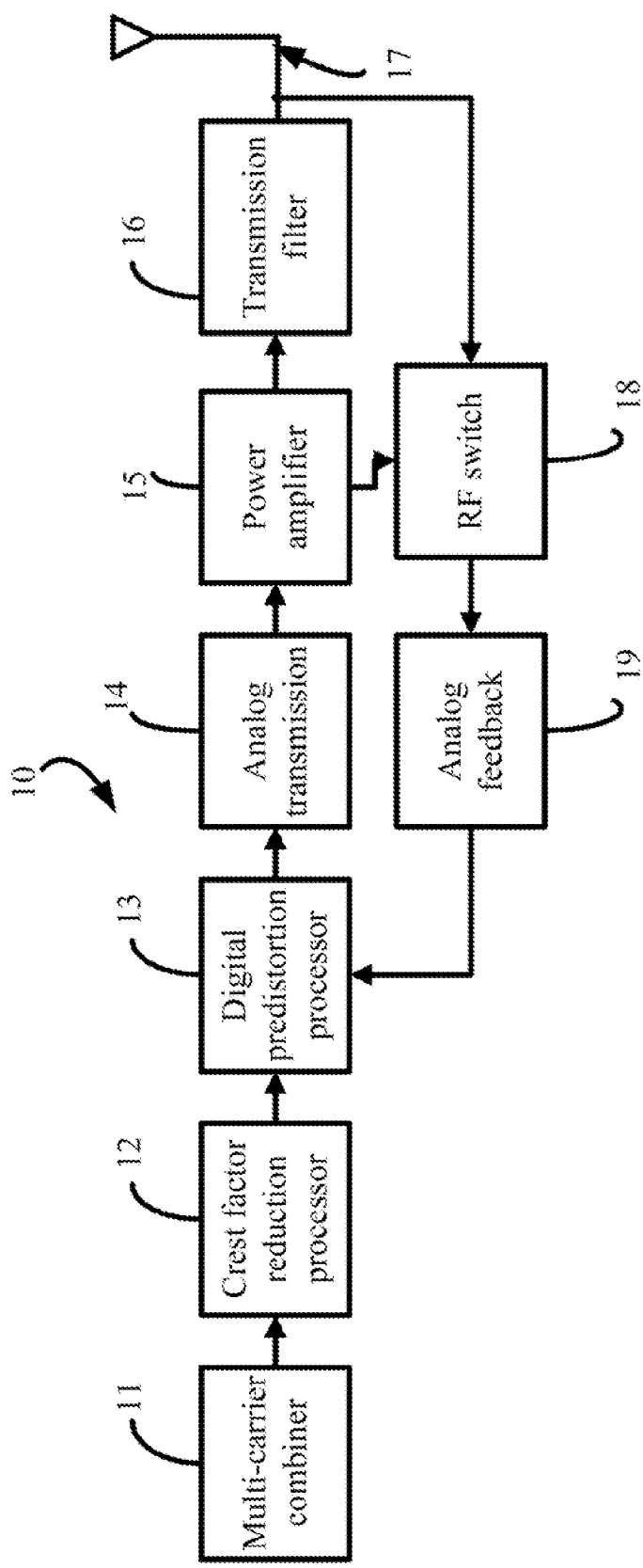
FIG. 1 is a block diagram of one embodiment of a multi carrier power amplifier (MCPA) transmission system.

FIG. 1 shows a block diagram of a MCPA transmission system 10 with a digital pre-distortion (DPD) processor 13, with feedback for closed loop adaptation. The feedback of the DPD processor 13 comprises feedback signals captured and transmitted through a feedback path from a radio frequency (RF) switch 18 which selects the captured feedback signal between the output of the PA 15 and the output of the transmitter filter 16. The feedback path comprises the RF switch 18 and an analog feedback unit 19. A multi-carrier combiner 11 transmits a multi-carrier signal to a crest factor reduction (CFR) processor 12. The multi-carrier signal denoted as a function x(t) of time variable t. The multi-carrier combiner 11 is an processor that combines multiple carriers on a common spectrum, where each carrier has an gain of $\gamma_1$ at a frequency $f_i$ to produce the composite signal y(t) expressed as follows:

$$y(t) = \sum_{i=1}^{N_\gamma} \gamma_i x_i(t) \cdot e^{j2\pi f_i t} \quad (1)$$

where $\gamma_i$ and $f_i$ are the carrier gain and frequency of the individual carrier, respectively with a subscript of variable i, j is a unit imaginary number, and $N_\gamma$ is a total number of the multiple carriers. Signal of the $i^{th}$ carrier is denoted as $x_i(t)$.

The multi-carrier signal is processed by the crest factor reduction processor 12 to reduce the peak to average ratio (PAR) so that the waveform can be transmitted at levels with a root mean square (rms) value closer to the saturated PA output power. The signal after the CFR processor 12 is then processed with a DPD engine 13 before passing the signal to the analog/RF transmitting path 14 followed by the power amplifier 15 and the transmission filter 16.

To suppress the intermodulation distortion (IMD), the DPD engine 13 performs a DPD algorithm 1100 to process the captured transmission signals with the captured feedback signals to extract the inverse PA characteristic, such as inverse PA characteristic of PA 15, and then applies the inverse PA characteristic as an inverse transfer function in the DPD processor to reverse the non-linearity of PA, such as non-linearity of PA 15.

The DPD engine 13 applies the linearization processing to correct distortion, and can improve the ACPR. However, this is based on a premise that the observation from the feedback path, such as a path in FIG. 1 is the same to the observation at the antenna output. In practice, the transmission signal is corrupted and captured feedback signal is not the same as the antenna output. Over transmission lines with many radio frequency/intermediate frequency (RF/IF) modules, the analog signal is corrupted by many multipaths or reflected signals. Even though the multipath or reflected signals have the same characteristics with the desired signal, they have different amplitudes, time delays and are at different phases. When the desired feedback signal is added to many multipaths or reflected signals having different delay times and phases, they can add constructively at some frequencies and destructively at other frequencies causing amplitude and delay variations. These amplitude and delay variations over the transmission and feedback bandwidth cause the distortion in the captured feedback signals for the observation feedback path and will degrade the DPD linearization performance.

Amplitude variations and the group delays may be caused by multipath signals. A multipath signal having different amplitude and phase is added to the desired it would cause amplitude variations and different delays over the frequency. This substantially limits the DPD linearization performance, especially when the delay between the multipath signal and the desired signal is large.

For the case of multiple reflections, the phase differences cause different peaks and valleys, and the amplitude variations and group delay variations are increased. Over temperature the spectral response profile can change, so it is necessary to adaptively correct this response.

Many other components have similar characteristics too. For example, the transmission cable to the power amplifier input, and the cable from the PA output to the feedback receiver can include a significant reflected signal with large delay. These can cause substantial distortions to the feedback path.

This disclosure shows a method to compensate for the effects of the multipath and reflection signals and other distortions to substantially improve the DPD linearization performance. An electronic wireless communication device in accordance with the present disclosure may comprise an MCPA transmission system. The disclosure focuses on a proposed method of multipath compensation for digital pre-distortion linearization. Embodiments of systems, devices, and a method of multipath compensation for digital pre-distortion linearization is given in the following. The disclosed systems and communication devices may be implemented as a stand-alone device, or integrated into various network gateway devices or network terminal devices. The various network gateway devices comprise base stations, bridges, routers, switches, or hot spots or access points for wireless networking. The network terminal devices comprise set-top boxes, cell phones, tablet personal computers, laptop computers, multimedia player, digital cameras, personal digital assistants (PDAs), navigation devices, or mobile internet devices (MID).

Figure 2:
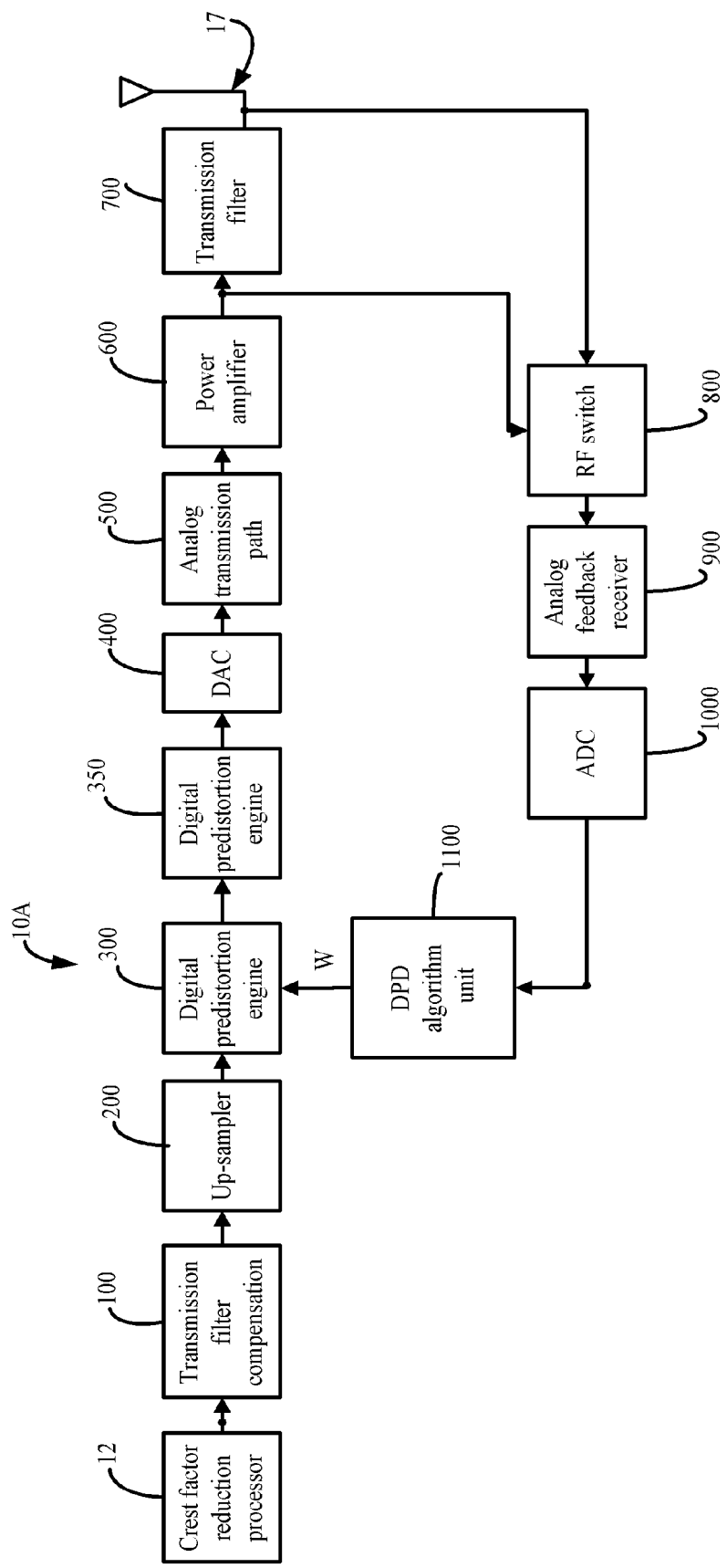
FIG. 2 shows a block diagram of one embodiment of a multi carrier power amplifier (MCPA) transmission system according to the present disclosure.

FIG. 2 shows a typical wireless transmission communication system. A CFR processing block 12 first receives and processes the multi-carrier signal to generate post CFR signals. The CFR processor 12 performs crest factor reduction (CFR) to reduce the peak to average ratio (PAR) or so called crest factor of the multi-carrier signal in the digital domain The output of the CFR processing block 12 is sent to a transmission filter compensation 100 that is operable to correct for the distortion of the transmission filter 700, and then up-converted to a sampling rate $R_{TX}$ using a Up-Sampler 200. The TFC 100 processes the post CFR signals to generate post TFC signals. The up-sampler up-samples the post TFC signals to a higher sampling rate that is wide enough to process an intermodulation bandwidth of the post TFC signals to generate up-sampled signals.

A digital pre-distortion (DPD) engine 300 generates the predistorted signal by applying digital pre-distortion to the up-sampled signals, which is then transmitted through a transmitting multipath compensation filter 350 followed with the DAC 400, an analog transmission path 500, and a power amplifier (PA) 600. This DPD engine 300 applies digital pre-distortion to the up-sampled signals between the up-sampler 200 and the PA 600 to compensate for non-linearity of the PA 600 and other non-linear analog components of the communication device 10A, and preferably facilitates the predistorted signals to have an inverse non-linearity to non-linearity of the PA 600. Since the predistorted signal has inversed non-linearity with the PA non-linearity, the net effect of the DPD engine 300 and PA 600 produces a linear PA where the intermodulation is suppressed. The out-of-band residue intermodulation products are then removed with a transmission filter 700 that can either be a duplexer filter or a simplex filter.

The DAC 400 converts the predistorted signals to generate analog predistorted signals, and transmits the analog predistorted signals to the PA.

Figure 3:
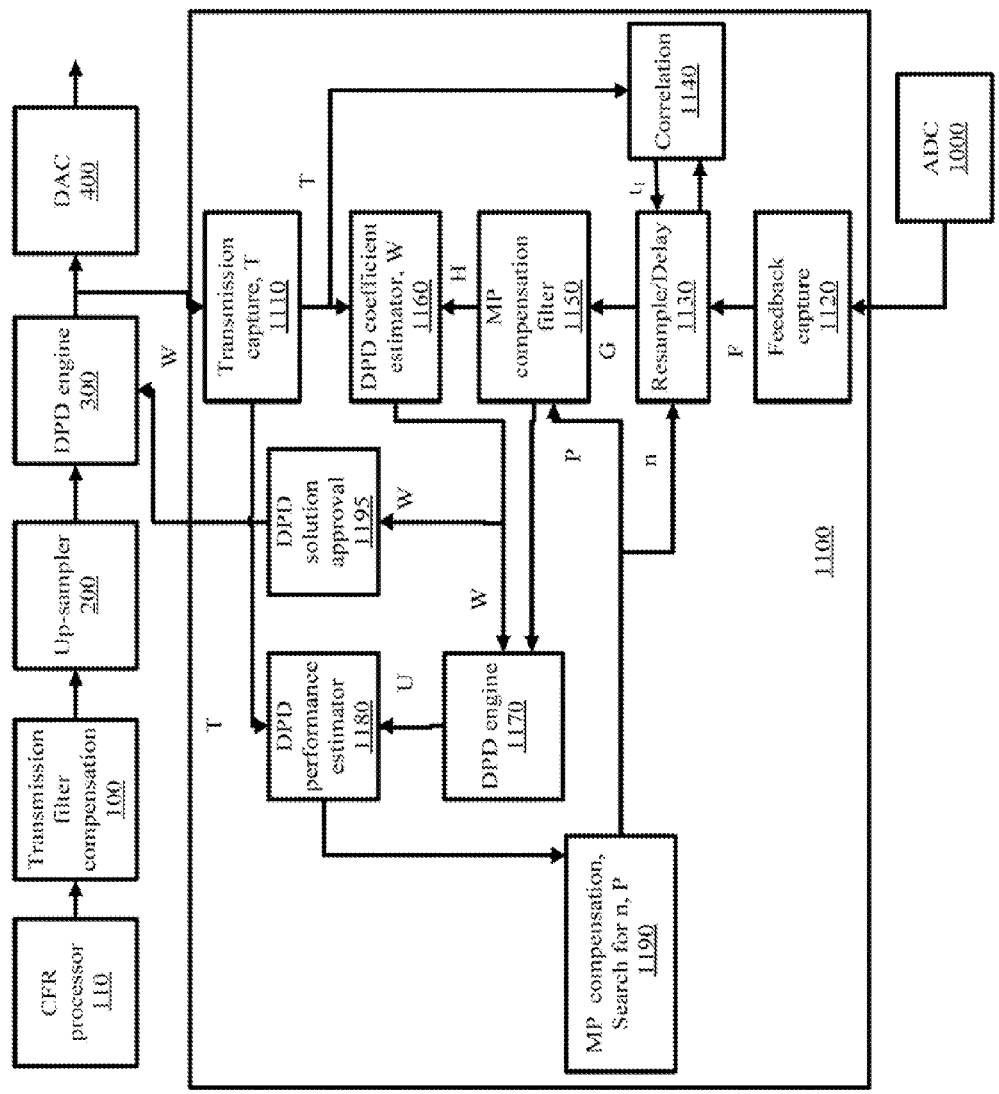
FIG. 3 shows a block diagram of one embodiment of a DPD algorithm and the Multipath compensation processing unit.

With reference to FIG. 3, a DPD linearizer algorithm unit 1100 comprises a DPD coefficients estimator 1160 and other components. To maximize the linearization performance, it is desirable to have the analog transmission path 500, the PA 600, and an analog feedback receiving path to have no linear distortion, leaving the DPD coefficients estimator 1160 in the DPD linearizer 1100 to evaluate the optimum filter coefficients. The DPD linearizer algorithm unit 1100 generates and outputs a DPD solution to the DPD engine 300 to enable the DPD engine 300 perform a DPD algorithm according to the DPD solution.

The DPD linearizer algorithm unit 1100 generates the DPD solution based on the predistorted signals sampled from the DPD engine 300 and feedback signals sampled from amplified signals output by the PA 600. The DPD linearizer algorithm unit 1100 receives feedback signals through the analog feedback receiving path which comprises a radio frequency (RF) switch 800, an analog feedback receiver 900, and an analog to digital converter (ADC) 1000. The DPD linearizer algorithm unit 1100 generates the DPD solution to suppress multi path distortion of the feedback signals sampled from amplified signals.

Block 100—Transmission Filter Compensation

The transmission filter compensation (TFC) 100 is operable to reverse the linear distortion of a transmission filter 700, such as a duplexer filter to assure the correct gain flatness of signals processed by the communication device 10A and consistent group delay from the source signal to the transmission filter 700. This linear distortion includes the amplitude ripple and group delay distortions to the transmission signal.

The TFC 100 is a programmable complex finite impulse response (FIR) with P taps. The output of the filter is expressed as $y_n$, where:

$$y_n = \sum_{i=1}^{N_y} v_i x_{n-i} \qquad (2)$$

The filter coefficients $v_i$ may be obtained from a transmission compensation algorithm unit, is the number of coefficients. The $x_{n-i}$ represents an input signal of the transmission compensation filter 100. The TFC 100 processes the post CFR signals to generate post TFC signals. The TFC 100 generates the post TFC signals to inverse and suppress distortion induced by a transmission path which comprises the up-sampler 200, the DPD engine 300, the DAC 400, and the PA 600.

Block 200—Up-Sampler Filter

A up-sampler filter 200 increases the sampling rate of the signal output by the transmission filter compensation 100 to a rate $R_{TX}$ that is large enough to cover the intermodulation bandwidth required for correction of the significant intermodulation products of the signal. For example, if the signal bandwidth of the output of the TFC 100 is 100 MHz, having a sampling rate of 125 Ms/s, and the significant intermodulation distortion (IMD) is the $5^{th}$ order, then the 100 MHz signal may need to be resampled to support a fifth order IMD, or 500 MHz bandwidth. This requires an up-sampling order of 4.

Block 300—DPD Engine

A DPD engine 300 can be a polynomial-based linearizer, but can also be other DPD techniques, such as look up table technique, or other methods which perform non-linear signal processing to suppress the IMD caused by the non-linearity in the PA. The disclosure discussed here does not include the details of such a non-linear DPD engine, but focuses more on the methods to suppress the linear distortion to enhance or improve the performance of the DPD engine and the amount of non-linear correction which can be achieved.

Theoretically, the DPD engine 300 implements a process to convert the desired incoming signal by applying the distortion that is defined from the DPD linearizer algorithm unit 1100 in order to generate the predistorted signal, which has the inverse nonlinearity to compensate nonlinearity of the PA and other analog components.

$$z=DPD(y)=PA^{-1}(y) \quad (3)$$

where y is the DPD input of the DPD engine 300 and z is the predistorted signal output by the DPD engine 300. If DPD is truly the inverse of the PA then the output of the PA would be the same as that of the input signal. From an illustration point of view, the PA output, p, is expressed as:

$$p=PA(z)=PA(DPD(y))=PA(PA^{-1}(y))=y \quad (4)$$

And since DPD input y has no out-of-band intermodulation, it is expected that the output of the PA 600 has suppressed intermodulation.

However, if the transmission and feedback signals are corrupted with multipaths and reflections, the DPD engine 300 is no longer the truly inverse of the PA 600, and thus the PA 600 has some residue IMD. Block 1100 would attempt to find the necessary correction factors in time, amplitude and phase, and apply these corrections to the feedback path to improve to the best possible linearization.

Block 350—Transmission Multipath (MP) Compensation Filter

The transmission multipath (MP) compensation filter 350 uses a $N_Q$ taps FIR fitter to reverse the effects of the multipaths or reflections occurred in the transmitting path and the power amplifier. The filter is expressed as:

$$o_n = \sum_{i=1}^{N_Q} Q_i j_{n-i}$$

where j and o are the input and output of the transmission multipath (MP) compensation filter 350, $Q_n$ is the coefficients and $N_Q$ is the number of taps of the filter 350. During the system calibration, or in DPD operation, the filter coefficients $Q_n$ are adjusted to achieve the best signal to noise ratio between the source signal and the data from the feedback signals.

Block 400—Digital to Analog Converter (DAC)

A DAC 400 converts the digital signal from a former stage, a transmission multipath compensation filter 350, into analog signal for RF transmission to a next stage, an analog transmission path 500. The DAC 400 is required to have high dynamic range so that the DAC quantization noise is not a substantial contribution to the system noise in the transmitting path.

Block 500—Analog Transmission

The analog transmitting path 500 up-converts the DAC signal into an RF signal that is sent to the PA 600 for power amplification.

It is preferred to maintain the analog transmitting path 500 with low distortion, such as low amplitude gain variations and also low group delay variations over the entire predistortion bandwidth.

Block 600—Power Amplifier

The RF power amplifier 600 converts a low power RF signal into the high power transmission signal for transmission. The power amplifier 600 may be a multi stage power amplifier, and should be optimized to have high efficiency by operate at near saturation zone of the power amplifier.

Block 700—Transmission Filter

A Transmission Filter 700 rejects the residue out-of-band noise of the high power transmission signal to prevent from interfering with an up-link receiver path, and other frequency bands as required by the Federal Communications Commission (FCC).

The Transmission Filter 700 can be a part of a duplexer for frequency division duplexing (FDD) systems or a simplex filter for time division duplexing (TDD) systems.

Since it's difficult to maintain the transmission signal with minimum distortion, the transmission compensation filter 100 can correct the signal distortion during signal transmission. Because of the sharp amplitude transition at the band edges, the transmission filter 700 can cause undesirable distortion such as sharp amplitude roll-off and rapid group delay changes that degrades the error vector magnitude (EVM).

Block 800—RF Switch

The RF switch 800 is operable to switch feedback signals from the output of the PA 600 or the output of the transmission filter 700 to the receiver path. The RF switch operates in two modes:

(1) DPD Linearization Mode for linearization of the PA: In the DPD linearization mode of the RF switch 800, the RF switch 800 is set to capture the signal from the output of the PA 600 to perform the DPD linearization processing (2) Transmission Filter Compensation Mode for equalization of the transmission filter variations and group delays: In the transmission filter compensation mode of the RF switch 800, the RF switch is set to capture the output signal from the output of the transmission filter 700 or input of antenna 17 to perform the transmission filter compensation.

Most of the time, the RF switch is set to the DPD linearization mode to provide the fast update of the DPD coefficient W, and occasionally, the RF switch is set to the Transmission filter compensation mode when needed.

Block 900—Analog Feedback Receiver

An analog feedback receiver 900 down-converts the RF signal from the PA 600 into an intermediate frequency (IF) or baseband signal that can be digitized using an analog to digital converter (ADC) 1000. It is preferred to maintain the analog feedback receiver path with low distortion, such as low amplitude gain variations and low group delay variations over the entire bandwidth of the feedback path.

Block 1000—Analog to Digital Converter (ADC)

An ADC 1000 converts the analog signal into a digital signal for digital processing to linearize the transmitting path including the PA 600 and equalize the transmission filter 700. The ADC is required to have sufficient dynamic range so that ADC quantization noise is not a limiting factor in the quality of the equalization processing.

Block 1100—DPD Linearizer Algorithm

FIG. 3 shows the block diagram of the DPD linearizer algorithm unit 1100. The signal processing is performed on the samples $T_i$ of captured transmission signal T and feedback sample $F_i$ of captured feedback signal F to extract the best possible solution polynomial coefficient set W for the DPD engine 300.

Block 1110—Transmission Capture random access memory (RAM)

The transmission output signal output from the DPD engine 300 is captured for the DPD linearization algorithm 1100 before output to the DAC 400. This is the predistorted signal, and thus has a wide signal bandwidth. A total of $N_{TX}$ baseband IQ samples, captured at sampling rate $R_{TX}$ are stored in the transmission capture RAM 1110.

Block 1120—Feedback Capture RAM

The output of the ADC 1000 is the digital feedback signal, to be converted to baseband IQ signal if the feedback is at IF. A total of $N_{FB}$ baseband IQ samples, at a sampling rate $R_{FB}$, of the feedback ADC are stored in a feedback capture RAM 1120 for subsequent linearization processing or transmission compensation processing.

Block 1130—Resample and Delay

A resampler 1130 comprises an interpolation filter and a delay pointer connected to a decimation filter which can be implemented using a polyphase structure. The interpolation filter resamples the feedback signals received by the feedback capture RAM 1120 to a higher sampling rate, $K \cdot R_{TX}$, where $R_{TX}$ is the sampling rate of the digital predistortion engine 300, K is an integer that is reasonably large, such as 4, 6, or 8. The feedback signal is then processed by the delay pointer to adjust the correlation position.

The decimation filter receives and decimates the feedback signals from the delay pointer to the rate of $R_{TX}$. The interpolation filter receives correlation position n and set the pointer in the delay pointer to adjust the signal with a resolution of $$\frac{1}{K \cdot R_{TX}}.$$

The interpolated samples enable the resampler to adjust the pointer for the best time delay that has highest SNR or ACPR in order to achieve the best DPD performance.

Block 1140—Correlation

The correlation unit 1140 performs a correlation process to search for the best timing offset $t_1$ between the interpolated feedback signal and the captured transmission signals from a transmission capture RAM 1110. The correlation process can be accomplished by searching for the location of peak signal value $SNR_n$.

$$SNR(n) = \frac{\left|\sum_{i=1}^{L} U_i T'_{i-n}\right|^2}{\left|\sum_{i=1}^{L} U_i U'_{i-n}\right| \cdot \left|\sum_{i=1}^{L} T_i T_{i-n}\right| - \left|\sum_{i=1}^{L} U_i T'_{i-n}\right|^2} \quad (5)$$

where

L is the integration length.

$U_i$ is the output samples of the DPD engine 1170, i is a integer variable belonging to $\{1:L\}$.

$T_i$ is the output of the transmission capture RAM 1110, i is a integer variable belonging to $\{1:L\}$.

$U_i'$ and $T_i'$ are the complex conjugates of the samples $U_i$ and $T_i$, respectively.

In searching for the maximum value of SNR, the correlation position n can be extracted and applied to the block 1130 to adjust the delay. The resampler 1130 aligns the captured transmission signal and the captured feedback signal according to the determined best timing offset and the correlation position n.

Block 1150—Feedback Multipath Compensation Filter

A feedback multipath (MP) compensation filter 1150 suppresses different multipaths or reflections that distort the feedback signal, so that the DPD algorithm processing can determine the optimum solution for the DPD engine 300. The multipath compensation filter 1150 performs finite impulse response (FIR) digital filtering to suppress multi path distortion of the feedback signals sampled from amplified signals. The filter is expressed as $$H_n = \sum_{i=1}^{N_P} P_i G_{n-i} \quad (6)$$

where $N_P$ is the number of taps, $P_i$'s are the filter coefficients, and G and H are the input and output of the feedback MP Compensation filter 1150. $G_{n-i}$ and $H_n$ are respectively samples of G and H.

The feedback compensation optimization process (block 1190) searches for the optimum filter coefficients $P_i$, and apply the optimum filter coefficients $P_i$ at the feedback MP filter 1150.

Block 1160—DPD Coefficients Estimator

The DPD coefficients estimator 1160 computes the DPD polynomial coefficients W with lowest rms error using normal equation and provides the DPD polynomial coefficients W to DPD engine 1170. The DPD coefficients estimator 1160 generates the DPD polynomial coefficients W as a first digital predistortion (DPD) solution. This processing can be tailored for different linearization designs, and is out of the scope of this disclosure.

Block 1170—DPD Engine

The DPD engine 1170 applies the polynomial coefficients W extracted from the DPD coefficients estimator (Block 1160) to produce the predistorted signal U that is sent to a DPD performance estimator 1180. The DPD engine 1170 can be tailored for different linearization designs, and is out of the scope of this disclosure.

Block 1180—DPD Performance Estimator

The DPD engine 1170 generates predistorted signal U according to a DPD solution W. A DPD performance estimator 1180 compares the predistorted signal U to the captured transmission signals T to determine the SNR or the ACPR of a DPD solution currently utilized by DPD engine 1170.

The SNR of the DPD solution is computed as in Equation 5. The ACPR of the DPD solution is computed as $$ACPR = 10 * \log_{10}\left(\frac{P_{FUN}}{P_{IMD}}\right) \quad (7)$$

$$P_{FUN} = \sum_{i=1}^{L} F(|T_i|^2, f_{FUN}, B) \quad (8)$$

$$P_{IMD} = \sum_{i=1}^{L} F(|T_i - Z_i|^2, f_{IMD}, B) \quad (9)$$

where $f_{FUN}$ is the frequency of a fundamental carrier, $f_{IMD}$ is the frequency of the observed sideband, B is the carrier bandwidth, and F(x,f,B) is the bandpass filter of signal x with an IF centering at frequency f and bandwidth B. This process can be implemented with digital signal processing using captured transmission and feedback signals.

Block 1190—Feedback Multipath (MP) Compensation Search

The feedback MP compensation search engine 1190 searches for the optimum delay point n as a second time offset and searches for the compensation filter coefficients P for utilization by the MP compensation filter 1150 as indicated in Equation (6). The search is performed to find the delay n and the filter coefficient P that would give the best SNR or best ACPR as computed in a DPD performance estimator 1180. The feedback MP compensation search engine 1190 has two search options.

Option 1—Brute Force Search Method for n and P

A brute-force method is to search for the delay n, the amplitude $a_i$, and the phase $\theta_i$ of $P_i$ (i=1 to $N_p$). A set illustrated in the following description is enclosed by a curly bracket "{ }." The search is operated in conjunction with block 1130, block 1150, block 1160, block 1170 and block 1180 with the purpose to find the maximum SNR or ACPR, as shown in the following pseudo codes:

1—Block 1190 sets n=0, $\{a_i\}$=0, $\{\theta_i\}$=0
2—Block 1130 activates delay n
3—Block 1150 activates $\{a_i\}$ and $\{\theta_i\}$
4—Block 1160 computes W, but only apply the weight to Block 1170 for performance estimation
5—Block 1170 computes U,
6—Block 1180 computes SNR and/or ACPR
7—Block 1190 adjusts n, $\{a_i\}$ and $\{\theta_i\}$
8—Repeat steps 2-7 until the highest SNR and/or ACPR are found. The value of n, $\{a_i\}$ and $\{\theta_i\}$ are the optimum values for Block 1150 that provides the weight W for the best SNR and/or ACPR.

Option 2—Direct Computation of $P_i$

This method directly computes the correction filter $P_i = a_i e^{j\theta_i}$ $$H_n = \sum_{i=1}^{N_P} P_i G_{n-i} \quad (10)$$

The coefficient P can be solved by a normal equation, expressed as $$(F'F) \cdot P = (F'T) \quad (11)$$

where $$F = \begin{bmatrix} f_0 & f_{-1} & \cdots & f_{1-N_P} \\ f_1 & f_0 & \cdots & f_{2-N_P} \\ f_2 & f_1 & \cdots & f_{3-N_P} \\ f_3 & f_2 & \cdots & g_{4-N_P} \\ f_4 & f_3 & \cdots & f_{5-N_P} \\ \cdots & \cdots & \cdots & \cdots \\ f_{NN-1} & f_0 & \cdots & f_{NN-N_P} \end{bmatrix} \quad (12)$$

$$P = \begin{bmatrix} P_1 \\ P_2 \\ \cdots \\ P_{N_P} \end{bmatrix} \quad (13)$$

$$T = \begin{bmatrix} t_1 \\ t_2 \\ t_3 \\ t_4 \\ t_5 \\ \cdots \\ t_{NN} \end{bmatrix} \quad (14)$$

where $F=\{f_n\}$ is the captured feedback samples, $T=\{t_n\}$ is the captured transmission samples, F' is the conjugate of F, and NN is the number of samples that is used to process to estimate the coefficient set P.

Solving the above normal equation, the filter coefficients $P_i$ can be extracted.

$$P_i = a_i e^{j\theta_i} \quad (15)$$

The filter coefficients $P_i$ is then applied for Block 1150.

Block 1195—DPD Solution Verification Unit

The DPD performance estimator 1180 receives predistorted signals U from DPD engine 1170 which is based on a DPD algorithm solution W and provides the SNR or ACPR results of the predistorted signals. The DPD solution verification unit 1195 reviews the computed SNR and/or the ACPR of the DPD algorithm solution. A SNR threshold $SNR_T$ and an ACPR threshold $ACPR_T$ are pre-specified. If a SNR value $SNR_1$ and a ACPR value $ACPR_1$, for example, are associated with a specific $i^{th}$ DPD algorithm solution $W_i$, the DPD solution verification unit 1195 performs a determination as shown in the following pseudo codes:

If $SNR_1 > SNR_T$ or if $ACPR_1 > ACPR_T$: Good DPD Solution
Otherwise: :Bad DPD Solution If the $i^{th}$ DPD solution is good, then the DPD solution verification unit 1195 passes the $i^{th}$ DPD solution $W_i$ to the DPD engines 300 and 1170 to process, since the $i^{th}$ DPD solution $W_i$ can gives good SNR and ACPR to the DPD/PA linearization loop. If not, the DPD solution verification unit 1195 ignores this $i^{th}$ DPD solution and the DPD engines 300 continues to use the previous DPD solution until an updated DPD solution is found which meets the verification criteria.

The method of multipath compensation for DPD improves the digital pre-distortion (DPD) linearization performance by suppressing the linear distortion caused by the reflected signals and distortion in the transmitting and feedback paths. This allows the DPD engine to dedicate most of its linearization resources for suppression of non-linearity in the PA and the remaining distortions. The purpose of reflection suppression is to suppress effects of the distortion on the transmitting and receiving paths such that the DPD processor can achieve more effective linearization.

The component blocks in the communication device 10A may be integrated or at least partly integrated as an integrated circuit (IC) chip.

The foregoing disclosure of various embodiments has been presented for purposes of illustration and description. It is not intended to be exhaustive or to limit the disclosure to the precise forms disclosed. Many variations and modifications of the embodiments described herein will be apparent to one of ordinary skill in the art in light of the above disclosure. The scope of the disclosure is to be defined only by the claims appended hereto and their equivalents.

What is claimed is:

1. A method of multipath compensation for digital pre-distortion (DPD) linearization, executable by a communication device, comprising:
   receiving a multi-carrier signal and processing the multi-carrier signal in a crest factor reduction (CFR) stage of the communication device to generate post CFR signals;
   processing the post CFR signals with a transmission filter compensation (TFC) stage of the communication device to generate post TFC signals;
   in an up-sampling stage of the communication device, up-sampling the post TFC signals to a higher sampling rate that is wide enough to process an intermodulation bandwidth of the post TFC signals to generate up-sampled signals;
   applying digital pre-distortion (DPD) to the up-sampled signals in a first DPD engine of the communication device between the up-sampling stage and a power amplifier (PA) of the communication device to generate predistorted signals, wherein the predistorted signals has an inverse non-linearity distortion to compensate non-linearity of the PA of the communication device; and converting the predistorted signals in a digital to analog converter (DAC) of the communication device to generate analog predistorted signals;

transmitting the analog predistorted signals to the PA; and generating and outputting by a DPD linearizer algorithm stage of the communication device a DPD solution to the first DPD engine to enable the first DPD engine perform DPD algorithm according to the DPD solution, wherein the DPD linearizer algorithm stage generates the DPD solution based on the predistorted signals and feedback signals sampled from amplified signals output by the PA;

wherein the DPD linearizer algorithm stage generates the DPD solution to suppress multi path distortion of the feedback signals sampled from amplified signals.

2. The method as claimed in claim 1, wherein the DPD linearizer algorithm stage comprises a feedback multipath compensation filter, and the method further comprises:

performing finite impulse response (FIR) digital filtering by the feedback multipath compensation filter to suppress multi path distortion of the feedback signals sampled from amplified signals.

3. The method as claimed in claim 2, wherein the feedback multipath compensation filter comprises an FIR digital filter.

4. The method as claimed in claim 2, wherein the communication device comprises a second digital predistortion (DPD) engine, a DPD performance estimator, and a DPD solution approval unit, the method further comprises:

generating a first digital predistortion (DPD) solution by a digital predistortion coefficient estimator;

transmitting the first DPD solution to the second DPD engine;

performing digital predistortion by the second DPD engine according to the first DPD solution to generate a first predistorted signal;

performing by the DPD performance estimator an estimation of a first signal-to-noise ratio and a first adjacent channel power ratio associated with the first predistorted signal; and approving and providing by the DPD solution approval unit the first DPD solution to the first DPD engine based on a comparison between the first signal-to-noise ratio and a threshold signal-to-noise ratio and a comparison between the adjacent channel power ratio and a threshold adjacent channel power ratio.

5. The method as claimed in claim 4, further comprising:

generating the first digital predistortion (DPD) solution by the digital predistortion coefficient estimator based on a captured transmission signal and a captured feedback signal, wherein the captured transmission signal is sampled from an output of the first DPD engine and the captured feedback signal is sampled from an output of the power amplifier.

6. The method as claimed in claim 5, wherein the DPD linearizer algorithm stage further comprises a correlation unit and a delay unit, the method further comprises:

determining by the correlation unit a first time offset between the captured transmission signal and the captured feedback signal, and aligning by the delay unit the captured transmission signal and the captured feedback signal according to the determined first time offset.

7. The method as claimed in claim 6, wherein the DPD linearizer algorithm stage further comprises a feedback multipath compensation search engine operable to determine a second time offset between the captured transmission signal and the captured feedback signal, and the delay unit is operable to align the captured transmission signal and the captured feedback signal according to the determined second time offset.

8. The method as claimed in claim 7, wherein and the feedback multipath compensation search engine provides a multipath compensation function P to the feedback multipath compensation filter, and the feedback multipath compensation filter utilizes the multipath compensation function P to suppress multi path distortion of the feedback signals sampled from amplified signals.

9. The method as claimed in claim 1, wherein the DPD linearizer algorithm stage selects DPD solution from a plurality of DPD solutions based on estimation of signal-to-noise ratio (SNR) and adjacent channel power ratio (ACPR).

10. A communication device, comprising:

a crest factor reduction (CFR) stage operable to receive multi-carrier signal and processing the multi-carrier signal to generate post CFR signals;

a transmission filter compensation (TFC) stage operable to process the post CFR signals to generate post TFC signals;

an up-sampling stage up-sampling the post TFC signals to a higher sampling rate that is wide enough to process an intermodulation bandwidth of the post TFC signals to generate up-sampled signals;

a first digital pre-distortion (DPD) engine operable to apply digital pre-distortion to the up-sampled signals between the up-sampling stage and a power amplifier (PA) of the communication device to generate predistorted signals, wherein the predistorted signals has an inverse non-linearity distortion to compensate non-linearity of the PA of the communication device; and a digital to analog converter (DAC) operable to convert the predistorted signals to generate analog predistorted signals, and transmission the analog predistorted signals to the PA; and a DPD linearizer algorithm stage operable to generate and output a DPD solution to the first DPD engine to enable the first DPD engine perform DPD algorithm according to the DPD solution, wherein the DPD linearizer algorithm stage generates the DPD solution based on the predistorted signals and feedback signals sampled from amplified signals output by the PA;

wherein the DPD linearizer algorithm stage generates the DPD solution to suppress multi path distortion of the feedback signals sampled from amplified signals.

11. The device as claimed in claim 10, wherein the DPD linearizer algorithm stage comprises:

a multipath compensation filter operable to perform finite impulse response (FIR) digital filtering to suppress multi path distortion of the feedback signals sampled from amplified signals.

12. The device as claimed in claim 11, wherein the multipath compensation filter comprises an FIR digital filter.

13. The device as claimed in claim 12, wherein the communication device further comprises:

a digital predistortion coefficient estimator operable to generate a first digital predistortion (DPD) solution;

a second DPD engine operable to perform digital predistortion according to the first digital predistortion solution to generate a first predistorted signal;

a DPD performance estimator operable to perform an estimation of a first signal-to-noise ratio and a first adjacent channel power ratio associated with the first predistorted signal; and a DPD solution approval unit approves and provides the first DPD solution to the first DPD engine based on a comparison between the first signal-to-noise ratio and a threshold signal-to-noise ratio and a comparison between the adjacent channel power ratio and a threshold adjacent channel power ratio.

14. The device as claimed in claim 13, wherein the digital predistortion coefficient estimator operable to generate the first digital predistortion (DPD) solution based on a captured transmission signal and a captured feedback signal, wherein the captured transmission signal is sampled from an output of the first DPD engine and the captured feedback signal is sampled from an output of the power amplifier.

15. The device as claimed in claim 14, wherein the DPD linearizer algorithm stage further comprises a correlation unit and a delay unit, the correlation unit is operable to determine a first time offset between the captured transmission signal and the captured feedback signal, and the delay unit is operable to align the captured transmission signal and the captured feedback signal according to the determined first time offset.

16. The device as claimed in claim 15, wherein the DPD linearizer algorithm stage further comprises a feedback multipath compensation search engine operable to determine a second time offset between the captured transmission signal and the captured feedback signal, and the delay unit is operable to align the captured transmission signal and the captured feedback signal according to the determined second time offset, and the feedback multipath compensation search engine provide a multipath compensation function P to the feedback multipath compensation filter, and the feedback multipath compensation filter utilizes the multipath compensation function P to suppress multi path distortion of the feedback signals sampled from amplified signals.

17. The device as claimed in claim 10, wherein the TFC stage generates the post TFC signals to inverse and suppress linear distortion induced by a transmission path which comprises the up-sampling stage, the first DPD engine, the DAC, and the PA.

18. The device as claimed in claim 10, wherein the DPD linearizer algorithm stage selects DPD solution from a plurality of DPD solutions based on estimation of signal-to-noise ratio (SNR) and adjacent channel power ratio (ACPR).

* * * * *